(12) United States Patent
Mae et al.

(10) Patent No.: US 9,218,878 B2
(45) Date of Patent: Dec. 22, 2015

(54) SEMICONDUCTOR DEVICE AND CONTROL METHOD FOR SEMICONDUCTOR DEVICE

(71) Applicant: ELPIDA MEMORY, INC., Tokyo (JP)

(72) Inventors: Kenji Mae, Tokyo (JP); Mitsuru Nakura, Osaka (JP); Kazuya Ishihara, Osaka (JP); Shinobu Yamazaki, Osaka (JP)

(73) Assignee: ELPIDA MEMORY, INC., Tokyo (JP)

( * ) Notice: Subject to any disclaimer, the term of this patent is extended or adjusted under 35 U.S.C. 154(b) by 139 days.

(21) Appl. No.: 14/084,824

(22) Filed: Nov. 20, 2013

(65) Prior Publication Data

US 2014/0140125 A1  May 22, 2014

(30) Foreign Application Priority Data

Nov. 20, 2012  (JP) ................. 2012-254595

(51) Int. Cl.
*G11C 11/00* (2006.01)
*G11C 13/00* (2006.01)

(52) U.S. Cl.
CPC ........ *G11C 13/0069* (2013.01); *G11C 13/0064* (2013.01); *G11C 13/0097* (2013.01); *G11C 13/0028* (2013.01); *G11C 2213/79* (2013.01)

(58) Field of Classification Search
CPC ........... G11C 13/0069; G11C 13/0064; G11C 13/0097
USPC ........................................ 365/148
See application file for complete search history.

(56) References Cited

U.S. PATENT DOCUMENTS

| 6,995,999 | B2 | 2/2006 | Morimoto | |
|---|---|---|---|---|
| 7,394,680 | B2 * | 7/2008 | Toda et al. | 365/148 |
| 7,817,457 | B2 * | 10/2010 | Tokiwa et al. | 365/148 |
| 8,514,607 | B2 | 8/2013 | Nakura et al. | |
| 8,665,632 | B2 * | 3/2014 | Toda | 365/148 |
| 8,687,406 | B2 * | 4/2014 | Toda | 365/148 |
| 8,817,523 | B2 * | 8/2014 | Sugimae | 365/148 |
| 2004/0264244 | A1 | 12/2004 | Morimoto | |
| 2012/0075909 | A1 | 3/2012 | Nakura et al. | |
| 2014/0185361 | A1 * | 7/2014 | Oh et al. | 365/148 |

FOREIGN PATENT DOCUMENTS

JP  2005-025914 A  1/2005
JP  2012-069220 A  4/2012

* cited by examiner

*Primary Examiner* — Viet Q Nguyen
(74) *Attorney, Agent, or Firm* — Sughrue Mion, PLLC

(57) ABSTRACT

A semiconductor device is provided with the variable resistance element, and a control circuit that controls a resistance state of the variable resistance element by controlling current between a first end and a second end of the variable resistance element. The control circuit causes the variable resistance element to change from a first resistance state to a second resistance state by having a first current flow from the first end to the second end of the variable resistance element. In addition, after a second current smaller than the first current is made to flow from the first end to the second end of the variable resistance element, the control circuit causes the variable resistance element to change from the second resistance state to the first resistance state by having a third current flow from the second end to the first end thereof.

7 Claims, 14 Drawing Sheets

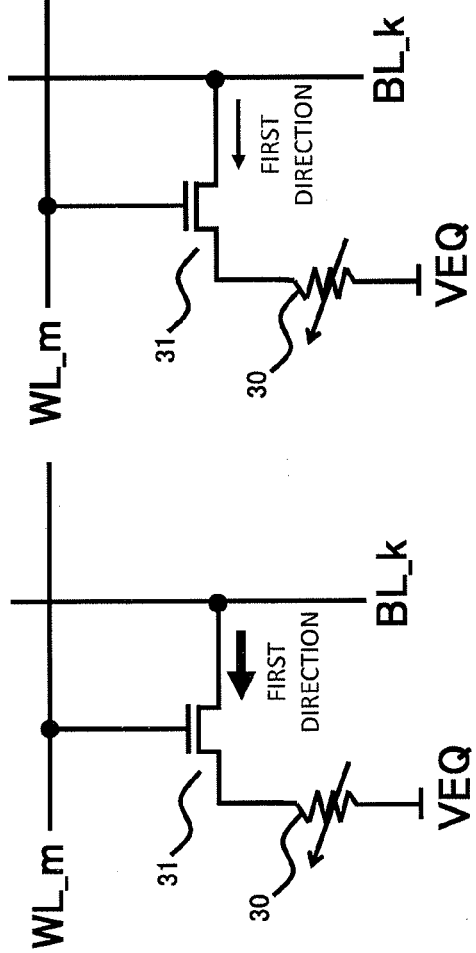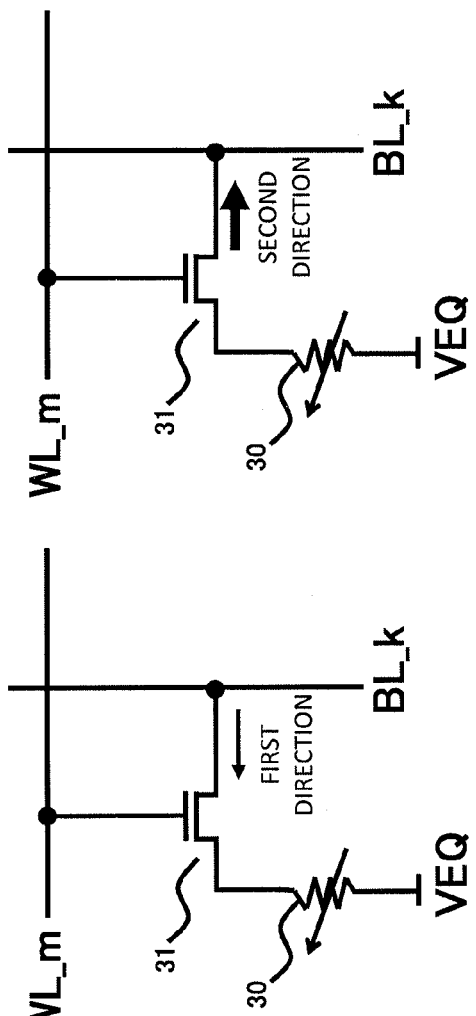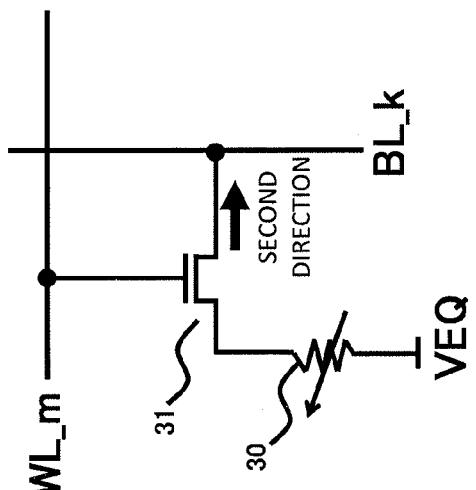

SEMICONDUCTOR DEVICE AND CONTROL METHOD FOR SEMICONDUCTOR DEVICE

REFERENCE TO RELATED APPLICATION

This application is based upon and claims the benefit of priority of Japanese patent application No. 2012-254595 filed on Nov. 20, 2012, the disclosure of which is incorporated herein in its entirety by reference thereto.

The present invention relates to a semiconductor device and a control method for the semiconductor device. In particular, the invention relates to a semiconductor device that includes a variable resistance element as a memory element, and a control method for the semiconductor device.

BACKGROUND OF THE INVENTION

JP Patent Kokai Publication No.2005-025914 (Patent Literature 1) discloses a nonvolatile semiconductor memory device (what is called resistive random access memory), where difference in resistance value of variable resistance elements corresponds to a logical value (data "0" or data "1"), and variable resistance elements are used as memory cells. Control with regard to the resistive random access memory disclosed in Patent Literature 1, for example, has current flow in opposite directions when writing (data "1") and when erasing (data "0"), and the amount of current thereof corresponds to the data, as shown in FIG. 9 and FIG. 11 of Patent Literature 1.

JP Patent Kokai Publication No.2012-069220 (Patent Literature 2) discloses a semiconductor memory device provided with a variable resistance element in which it is possible, in a random access writing operation, to write stably and with good control to a desired resistance state.

The respective disclosures of the abovementioned cited literatures are incorporated herein by reference thereto. The following analysis is given by the present inventors.

According to a control method disclosed in Patent Literature 1, it is possible to write desired data to a resistive random access memory. However, even if this control is executed, it is difficult to correctly write the desired data by performing write control once. As a result, in actuality, similar to flash memory and the like, in many cases the abovementioned write control is performed repeatedly, while performing verification by a verify operation.

Here, variation in resistance value of a variable resistance element is due to a process in which a current flows in the variable resistance element. Accordingly, with regard to control concerning where a current larger than necessary flows in the variable resistance element or where the number of times the current is made to flow is large, there is a possibility of an adverse effect occurring such that the lifespan of the variable resistance element is shortened or a time-related degradation characteristic deteriorates. Therefore, it is desired to have a semiconductor device that uses a variable resistance element that contributes to completing a data write operation in a suitable number of times and without more current than necessary being made to flow.

SUMMARY

According to a first aspect of the present invention there is provided a semiconductor device comprising: a variable resistance element, and a control circuit that controls a resistance state of the variable resistance element by controlling current between a first end and a second end of the variable resistance element, wherein the control circuit has a first current flow from the first end to the second end of the variable resistance element to cause the variable resistance element to change from a first resistance state to a second resistance state, and after having a second current smaller than the first current flow from the first end to the second end of the variable resistance element, the control circuit has a third current flow from the second end to the first end to cause the variable resistance element to change from the second resistance state to the first resistance state.

According to a second aspect of the present invention there is provided a semiconductor device comprising: a variable resistance element; and a control circuit configured to generate a first current flowing inside the variable resistance element in a first direction, to generate a second current smaller than the first current flowing inside the variable resistance element in the first direction and to generate a third current flowing inside the variable resistance element in a second direction opposite to the first direction.

According to a third aspect of the present invention there is provided a control method for a semiconductor device, the method comprising: changing a variable resistance element from a first resistance state to a second resistance state by having a first current flow from a first end to a second end of the variable resistance element; having a second current smaller than the first current flow from the first end to the second end of the variable resistance element; and changing the variable resistance element from the second resistance state to the first resistance state by having a third current flow from the second end to the first end.

BRIEF DESCRIPTION OF THE DRAWINGS

FIGS. 5A to 5C are diagrams for describing access to a memory cell.

PREFERRED MODES

Figure 1:
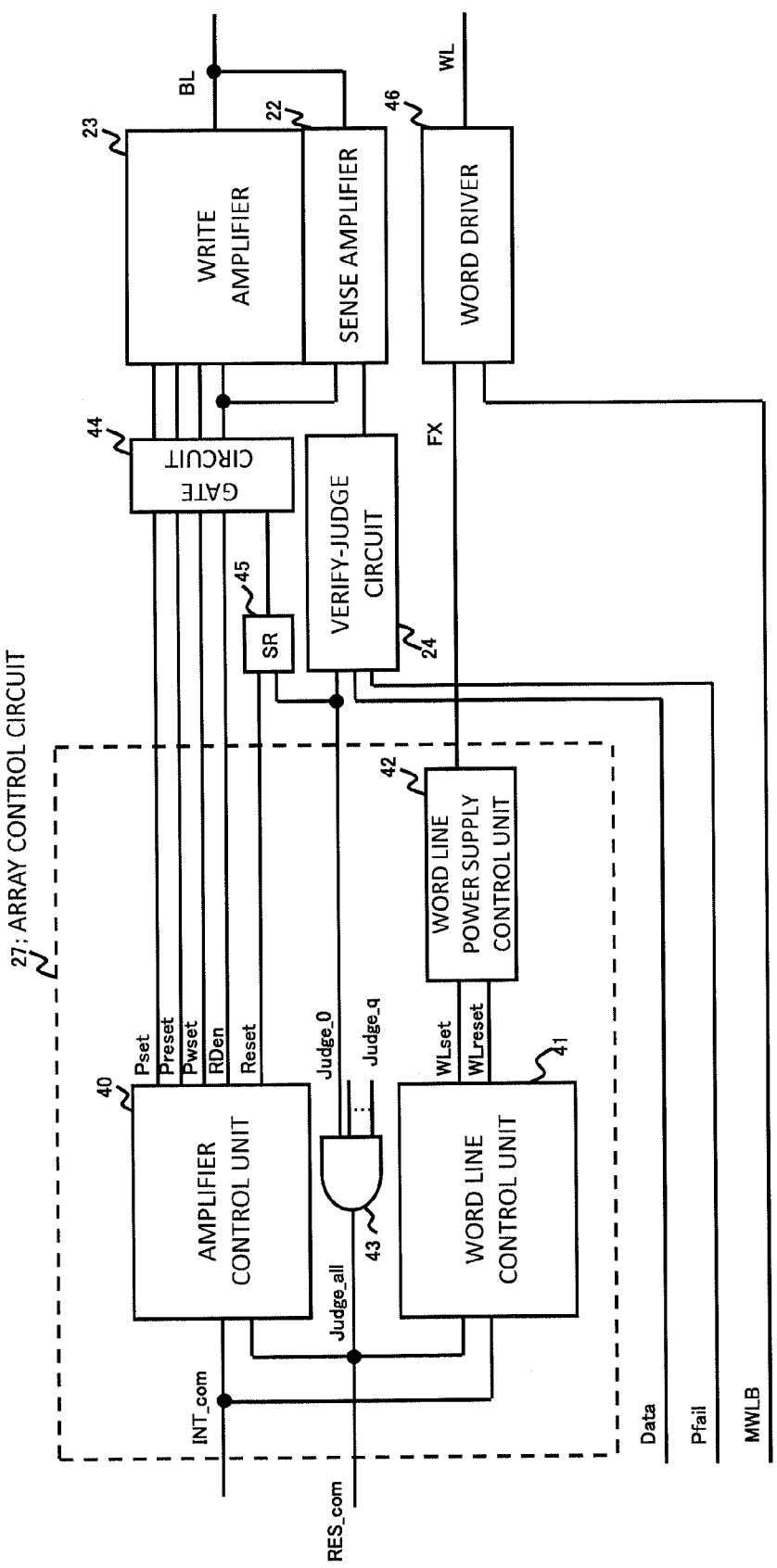
FIG. 1 is a diagram showing an example of an internal configuration of an array control circuit 27 and an example of various types of circuit included in respective banks, according to a first exemplary embodiment.
Figure 2:
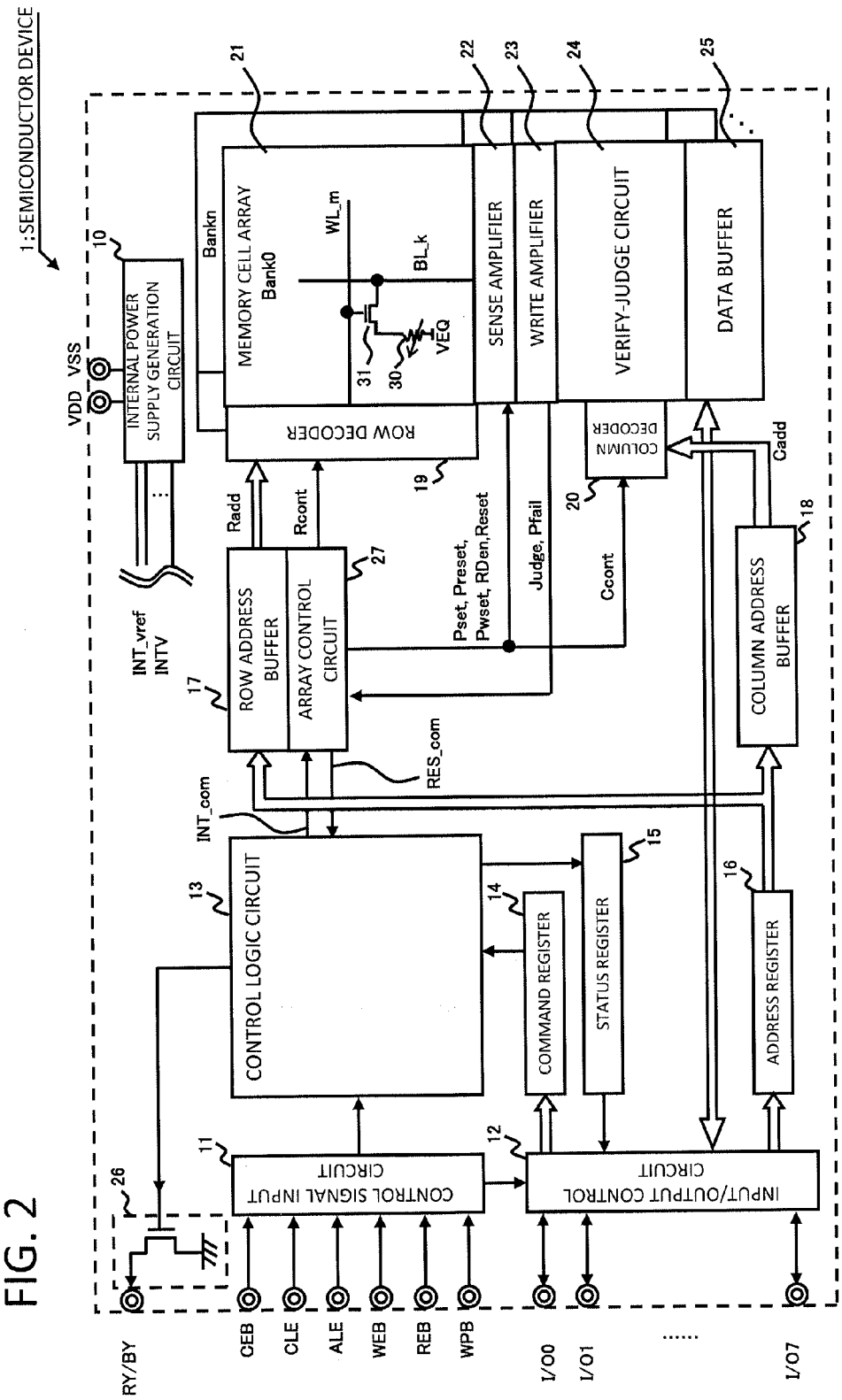
FIG. 2 is a diagram showing an example of an overall configuration of a semiconductor device 1 according to the first exemplary embodiment.

A description is given of an outline of an exemplary embodiment. As shown in FIG. 1 and FIG. 2, a semiconductor device is provided with a variable resistance element (for example, as indicated by reference numeral 30 in FIG. 2), and a control circuit (for example, a control logic circuit 13 or an array control circuit 27) that controls resistance states of the variable resistance element by controlling current between a first end and a second end of the variable resistance element. The control circuit changes the variable resistance element from a first resistance state to a second resistance state by having a first current flow from the first end to the second end of the variable resistance element. In addition, the control circuit changes the second resistance state of the variable resistance element to the first resistance state by having (causing) a third current flow (to flow) from the second end to the first end thereof, after having a second current smaller than the first current flow from the first end to the second end of the variable resistance element.

In order to change a resistance state of the variable resistance element, it is necessary to control a direction of current flowing in the variable resistance element and a current amount. In this regard, if a current repeatedly flows in the same variable resistance element, the resistance state of the variable resistance element is an incomplete resistance state that is neither the first resistance state nor the second resistance state. If, for example, an attempt is made to cause the variable resistance element to change to the first resistance state from this incomplete resistance state, since the resistance state of the variable resistance element is incomplete, the current amount flowing in the variable resistance element is different, and it is not possible to have a current necessary for a change to the first resistance state, to flow. Accordingly, it is necessary to shift this incomplete resistance state once to the second resistance state, to return to a resistance state in which a suitable current flows.

A current for resolving this incomplete resistance state is the second current, and is a current smaller than the first current. Here, if the first current flows in the variable resistance element in order to resolve the incomplete resistance state, a resistance state outside of the second resistance state results. That is, even if it is attempted to have the third current flow in the variable resistance element and change the resistance state of the variable resistance element to the first resistance state from the state outside of the second resistance state, there is a possibility of the first resistance state not being achieved and an incomplete resistance state again resulting. Therefore, by having the second current, which is smaller than the first current, flow in the variable resistance element, the incomplete resistance state is resolved. That is, the semiconductor device, in a case where current repeatedly flows in the same variable resistance element, controls the current flowing in the variable resistance element so as to be able to handle the resistance state of the variable resistance element being an incomplete resistance state. As a result, it is possible to change the resistance state of the variable resistance element in a suitable number of times, and without having a current flow more than necessary.

It is to be noted that in the present specification, an operation of writing data to a prescribed memory cell in response to a command provided from the outside is described as a "program". With regard to the program, an operation of writing to a memory cell corresponding to data "0" is called "data reset", and an operation of writing to a memory cell corresponding to data "1" is called "data set". That is, the program is realized by combining data reset and data set.

In a case where the resistance state of the variable resistance element configuring a memory cell is incomplete, an operation of having a small current flow in the same direction as the current flowing in the variable resistance element when performing a data set is called a "weak set". Furthermore, in a case where the resistance state of the variable resistance element is incomplete, an operation of having a small current flow in the same direction as the current flowing in the variable resistance element when performing a data reset is called a "weak reset".

Detailed descriptions are given below concerning specific exemplary embodiments, making reference to the drawings.

First Exemplary Embodiment

A more detailed description is given concerning a first exemplary embodiment, using the drawings.

FIG. 2 is a diagram showing an example of an overall configuration of a semiconductor device 1 according to the present exemplary embodiment. The semiconductor device 1 is provided with a variable resistance element (resistance variable element) as a memory cell. The semiconductor device 1 is provided with a control signal input terminal, an input/output terminal, a ready/busy signal output terminal, and a power supply terminal.

The control signal input terminal is configured from various terminals: a chip enable signal input terminal CEB, a command latch enable signal input terminal CLE, an address latch enable signal input terminal ALE, a write enable signal input terminal WEB, a read enable signal input terminal REB, and a write protect signal input terminal WPB.

Input/output terminals IO0 to IO7 receive an address and data when a memory cell is accessed. A command to the semiconductor device 1 is also included in a signal received by the input/output terminals IO0 to IO7.

The ready/busy signal output terminal RY/BY outputs a ready/busy signal. The ready/busy signal is a signal that gives notification to an outside that a program operation is executing in the semiconductor device 1. The semiconductor device 1 receives a power supply from the outside, via power supply terminals (VDD, VSS).

The semiconductor device 1 is configured to include: an internal power supply generation circuit 10, a control signal input circuit 11, an input/output control circuit 12, a control logic circuit 13, a command register 14, a status register 15, an address register 16, a row address buffer 17, a column address buffer 18, a row decoder 19, a column decoder 20, a memory cell array 21, a sense amplifier 22, a write amplifier 23, a verify-judge circuit 24, a data buffer 25, a buffer 26 that outputs the ready/busy signal, and an array control circuit 27.

The internal power supply generation circuit 10 generates various types of power supply to be used internally in the semiconductor device 1. The power supplies generated by the internal power supply generation circuit 10 are supplied to a group of circuits illustrated in FIG. 2, in addition to a group of circuits not illustrated. VSET, VEQ, VWLS, VWLR and the like are included in the power supplies generated by the internal power supply generation circuit 10. Applications and roles of these power supplies are described later. It is to be noted that in the following description, voltage supplied by the various types of power supply is described by the name of the power supply in question. For example, a voltage supplied by a power supply VSET is described as voltage VSET. INT_Vref and INTV illustrated in FIG. 2 are collective terms for reference voltage or power supply used in the various circuits.

The control signal input circuit 11 receives a control signal outputted by a controller connected to the semiconductor device 1, via the control signal input terminal. The control signal input circuit 11 outputs the received control signal to the input/output control circuit 12 and the control logic circuit 13.

The input/output control circuit 12 decodes a command from a signal received via the input/output terminals IO0 to IO7, and a signal outputted by the control signal input circuit 11, for registration in the command register 14. By referring to the status register 15 that stores operation states of the control logic circuit 13, transmission and reception of data via the input/output terminals IO0 to IO7 are realized. The input/output control circuit 12 decodes an address from a signal received via the input/output terminals IO0 to IO7, for registration in the address register 16. The input/output control circuit 12 stores write data in the data buffer 25, or reads data from the data buffer 25.

The control logic circuit 13 outputs an internal command INT_com to the array control circuit 27, in response to a control signal obtained from the control signal input terminal and a command registered in the command register 14. The control logic circuit 13 makes the array control circuit 27 access a memory cell included in the memory cell array 21, by outputting the internal command INT_com.

The control logic circuit 13 receives a response signal RES_com from the array control circuit 27. A result of access control with regard to the array control circuit 27 is included in the response signal RES_com. The result of access control is whether or not access has normally ended. The control logic circuit 13 makes a response to a command received from outside, in response to the response signal RES_com. If a program operation is being executed in a memory cell, the control logic circuit 13 gives notification thereof via the buffer 26 to the outside via the ready/busy signal output terminal RY/BY.

An address registered in the address register 16 is divided into a row address Radd and a column address Cadd, to be stored in the row address buffer 17 and the column address buffer 18 respectively. The row address Radd incorporated into the row address buffer 17 is supplied to the row decoder 19. The column address Cadd incorporated into the column address buffer 18 is supplied to the column decoder 20.

The semiconductor device 1 is configured to include a plurality of banks Bank0 to Bankn (n is a positive integer; this also applies below). The row decoder 19, the column decoder 20, the memory cell array 21, the sense amplifier 22, the write amplifier 23, the verify-judge circuit 24, and the data buffer 25 are included in each bank.

The memory cell array 21 includes a plurality of memory cells. Each memory cell is configured from a variable resistance element 30 and a selection transistor 31. A first end of the variable resistance element 30 is connected to a source or drain of the selection transistor 31, and a second end is connected to a power supply VEQ. A gate (control terminal) of the selection transistor 31 is connected to a word line WL, and a source or drain is connected to a bit line BL. It is to be noted that a bit line BL_k (k is a positive integer; this also applies below), as illustrated in FIG. 2, is a bit line connected to a memory cell that is to be accessed, among a plurality of bit lines extending in the memory cell array 21. The same applies to a word line WL_m (m is a positive integer; this also applies below). In FIG. 2, the variable resistance element 30 is arranged between the selection transistor 31 and the power supply VEQ. But the variable resistance element 30 may be arranged between the bit line BL and the selection transistor 31.

By decoding a row address Radd, the row decoder 19 selects a word line WL_m connected to a memory cell to be accessed, from word lines WL extending in the memory cell array 21. Similarly, by decoding a column address Cadd, the column decoder 20 selects a bit line BL_k connected to a memory cell to be accessed, from bit lines BL extending in the memory cell array 21.

By applying a prescribed voltage for a prescribed time to a bit line BL and reading resistance variation of the variable resistance element 30, the sense amplifier 22 reads data stored by the memory cell.

By switching a power supply connected to the bit line BL, the write amplifier 23 writes data to the memory cell.

The verify-judge circuit 24 is a circuit (data register) that compares data supplied from the outside and data read from a memory cell, and judges whether the two are matching or non-matching.

The data buffer 25 is a buffer provided to transmit data to, and receive data from, the outside, via the input/output terminals IO0 to IO7.

The array control circuit 27 receives the internal command INT_com outputted by the control logic circuit 13, and controls various types of circuit included in the row decoder 19, the column decoder 20 and respective banks. The array control circuit 27 outputs a control signal Rcont to the row decoder 19, and outputs a control signal Ccont to the column decoder 20. The array control circuit 27 outputs control signals (Pset, Preset, Pwset, RDen, Reset) to various circuits included in respective banks. The array control circuit 27 receives judgment signals (Judge, Pfail) from the respective banks.

The array control circuit 27 executes a program operation on a plurality of memory cells corresponding to a prescribed address included in the memory cell array 21, in response to a program command supplied from the outside. Each memory cell is selected according to a word line WL_m corresponding to a row address Radd and a bit line BL_k corresponding to a column address Cadd, and a control is performed according to the internal command INT_com.

More specifically, in a case where the internal command INT_com outputted by the control logic circuit 13 indicates a data set (writing of data "1") for a memory cell, the control signal Pset is activated. In a case where the internal command INT_com indicates a data reset (writing of data "0") for a memory cell, the control signal Preset is activated. In a case where the array control circuit 27 executes a weak set for a memory cell, the control signal Pwset is activated. In a case where the array control circuit 27 reads read data from a memory cell, the control signal RDen is activated.

In a case where the internal command INT_com indicates a data set or a data reset, the verify-judge circuit 24 performs verification of data read from the memory cell, and outputs the judgment signal (Judge) as a verification result. In a case where the judgment signal Judge indicates that data read from a memory cell and data designated to be written to a memory cell from the outside are matching, the array control circuit 27 ends control related to a data set or data reset. On the other hand, in a case where the judgment signal Judge indicates that the two items of data do not match, control according to respective internal commands INT_com is carried out once again (a data reset or data set is repeated). It is to be noted that a case where the judgment signal Judge is at an H level indicates that the data read from the memory cell and the data designated to be written to the memory cell from the outside are matching. A case where the judgment signal Judge is at an L level indicates that the two items of data are not matching.

FIG. 1 is a diagram showing an example of an internal configuration of the array control circuit 27 and an example of various types of circuit included in respective banks. With the exception of the array control circuit 27 of FIG. 1, the respective circuits are provided for each word line WL and bit line BL. Meanwhile, the array control circuit 27 is commonly provided for a word line WL and a circuit controlling a word line.

The array control circuit 27 includes an amplifier control unit 40, a word line control unit 41, a word line power supply control unit 42, and an AND circuit 43 that outputs a result of AND operation of a plurality of judgment signals Judge, as a judgment signal Judge_all. In addition to the sense amplifier 22, the write amplifier 23 and the verify-judge circuit 24, each bank contains a gate circuit 44, an SR latch 45, and a word driver 46.

The amplifier control unit 40 activates various types of control signal based on the internal command INT_com and the judgment signal Judge_all. That is, the amplifier control unit 40 controls the write amplifier 23 and the sense amplifier 22. It is to be noted that the judgment signal Judge_all is the result of AND operation on judgment signals Judge_0 to Judge_q (q is a positive integer; the same applies below) corresponding to respective memory cells.

The sense amplifier 22 connects a bit line BL to a prescribed power supply, and reads data from a memory cell according to potential variation in the bit line BL. The data that is read is sent to the verify-judge circuit 24.

The write amplifier 23 executes a program operation (data reset or data set) by connecting a bit line BL to a prescribed power supply, in response to a control signal outputted by the amplifier control unit 40.

The word line control unit 41 outputs control signals (WLset, WLreset) based on the internal command INT_com and the judgment signal Judge_all, to the word power supply control unit 42. The word line power supply control unit 42 controls the word driver 46 by switching a power supply connected to a sub word line FX.

The word driver 46 drives a word line WL using a power supply that is supplied by the sub word line FX, based on a word line selection signal MWLB outputted by the row decoder 19.

Figure 3:
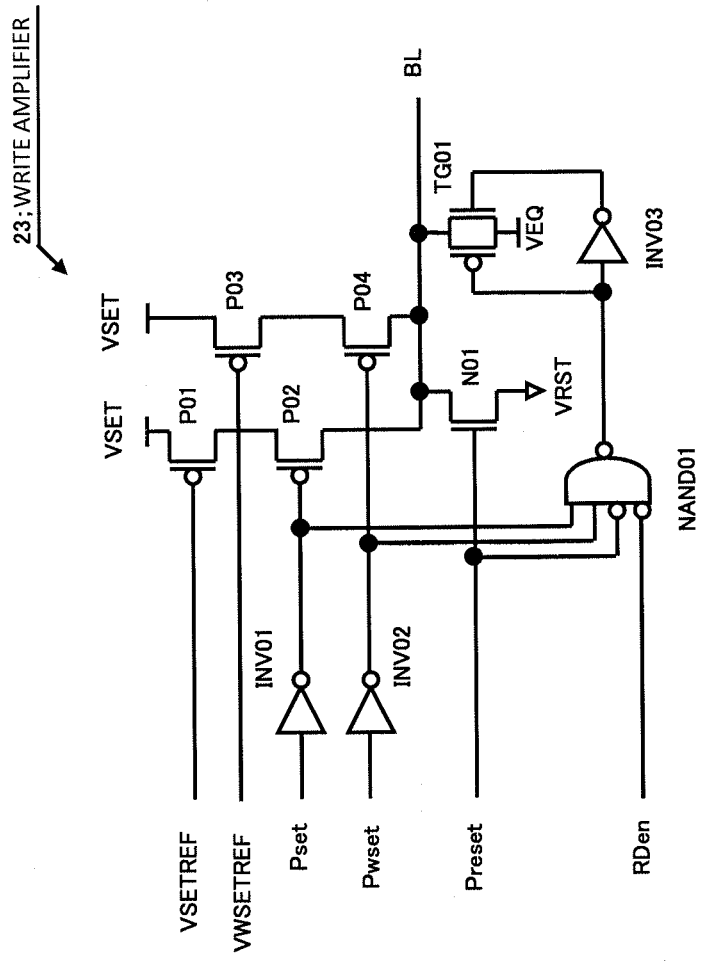
FIG. 3 is a diagram showing an example of a circuit configuration of a write amplifier 23.

FIG. 3 is a diagram showing an example of a circuit configuration of the write amplifier 23.

The write amplifier 23 is configured to include P channel MOS transistors P01 to P04, an N channel MOS transistor N01, a transfer gate TG01, inverter circuits INV01 to INV03, and a NAND circuit NAND01.

The write amplifier 23 switches a power supply connected to a bit line BL, in response to the control signals (Pset, Preset, Pwset, RDen).

More specifically, in a case where the control signal Pset is activated, the bit line BL and the power supply VSET are connected. In a case where the control signal Pwset is activated, a bit line BL and a power supply VWSET are connected. It is to be noted that reference voltages (VSETREF and VWSETREF, VSETREF is lower than the VWSETREF in this embodiment.) generated by the power supply VSET and the power supply VWSET are given to gates of P channel MOS transistors P01 and P03. In a case where the control signal Preset is activated, the line BL and a power supply VRST are connected.

In a case where the semiconductor device 1 is in a standby state, the control signals (Pset, Preset, Pwset, RDen) are in a non-activated state. In this case, by having the transfer gate TG01 conductive, a bit line BL is connected to the power supply VEQ. As a result, in a standby state, current is prevented from flowing in the variable resistance element 30. That is, a generation of a leak current is prevented.

Figure 4:
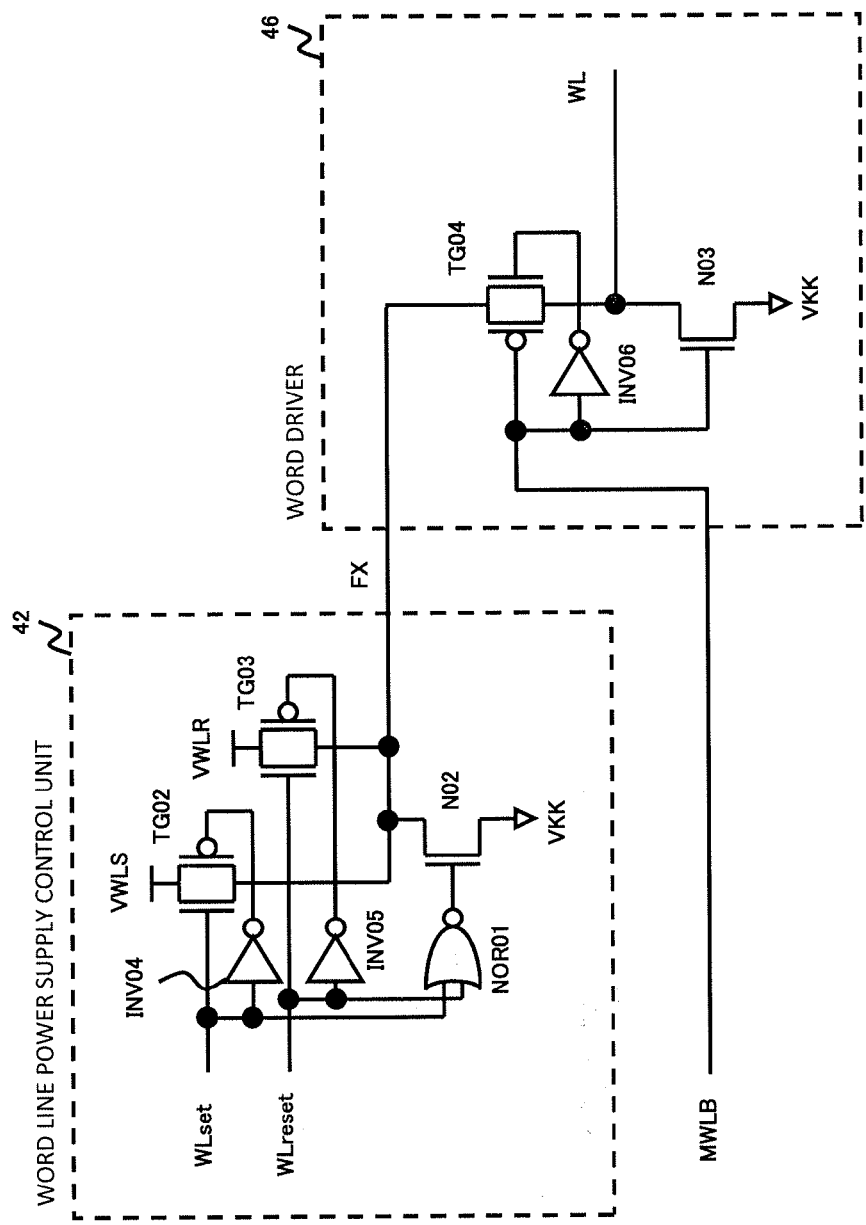
FIG. 4 is a diagram showing an example of a circuit configuration of a word line power supply control unit 42 and a word driver 46.

FIG. 4 is a diagram showing an example of a circuit configuration of the word line power supply control unit 42 and the word driver 46.

The word line power supply control unit 42 is configured to include an N-channel MOS transistor N02, transfer gates TG02 and TG03, inverter circuits INV04 and INV05, and a NOR circuit NOR01. The word driver 46 is configured to include an N-channel MOS transistor N03, a transfer gate TG04, and an inverter circuit INV06.

The word line power supply control unit 42 switches a power supply connected to a sub word line FX, in response to the control signals (WLset, WLreset) outputted by the word line control unit 41. The word driver 46 connects a word line WL and a power supply (VWLS, VWLR) supplied by the word line power supply control unit 42, in response to the word link selection signal MWLB.

Next, an outline is given concerning access to a memory cell.

FIGS. 5A to 5C are diagrams for describing access to the memory cell. As described above, a program operation to write data to the memory cell is a combination of a data reset and data set.

In a data set, the variable resistance element 30 is in a low resistance state. In order to have the variable resistance element 30 in a low resistance state, a current flows in the variable resistance element 30, from the selection transistor 31 towards the power supply VEQ, as shown in FIG. 5A. It is to be noted that in the following description, a direction from the selection transistor 31 towards the power supply VEQ is a first direction, and a current at this time is a first current.

When a data reset is performed consecutively as described above, a weak set is performed between data resets. The weak set is realized by making a current flow in the first direction in the variable resistance element 30, as shown in FIG. 5B, and at the same time making this current amount smaller than the current amount at the time of a data set. The current flowing at the time of the weak set is a second current.

In a data reset, the variable resistance element 30 is in a high resistance state. In order to have the variable resistance element 30 in a high resistance state, a current flows in the variable resistance element 30 from the power supply VEQ towards the selection transistor 31, as shown in FIG. 5C. It is to be noted that in the following description, a direction from the power supply VEQ towards the selection transistor 31 is a second direction, and a current at this time is a third current.

When data is read from a memory cell, the data held by the memory cell is determined according to length of time required for potential variation in a bit line BL. More specifically, in a case where the variable resistance element 30 has a low resistance (holds data "1"), potential variation is fast. On the other hand, in a case where the variable resistance element 30 has a high resistance (holds data "0"), potential variation is slow. The sense amplifier 22 detects difference in potential variation in the bit line and reads data from the memory cell.

Next, a description is given concerning operations of the semiconductor device 1. Here, a description is given concerning operations of the semiconductor device 1 in a case of receiving a program instruction from the outside.

Figure 6:
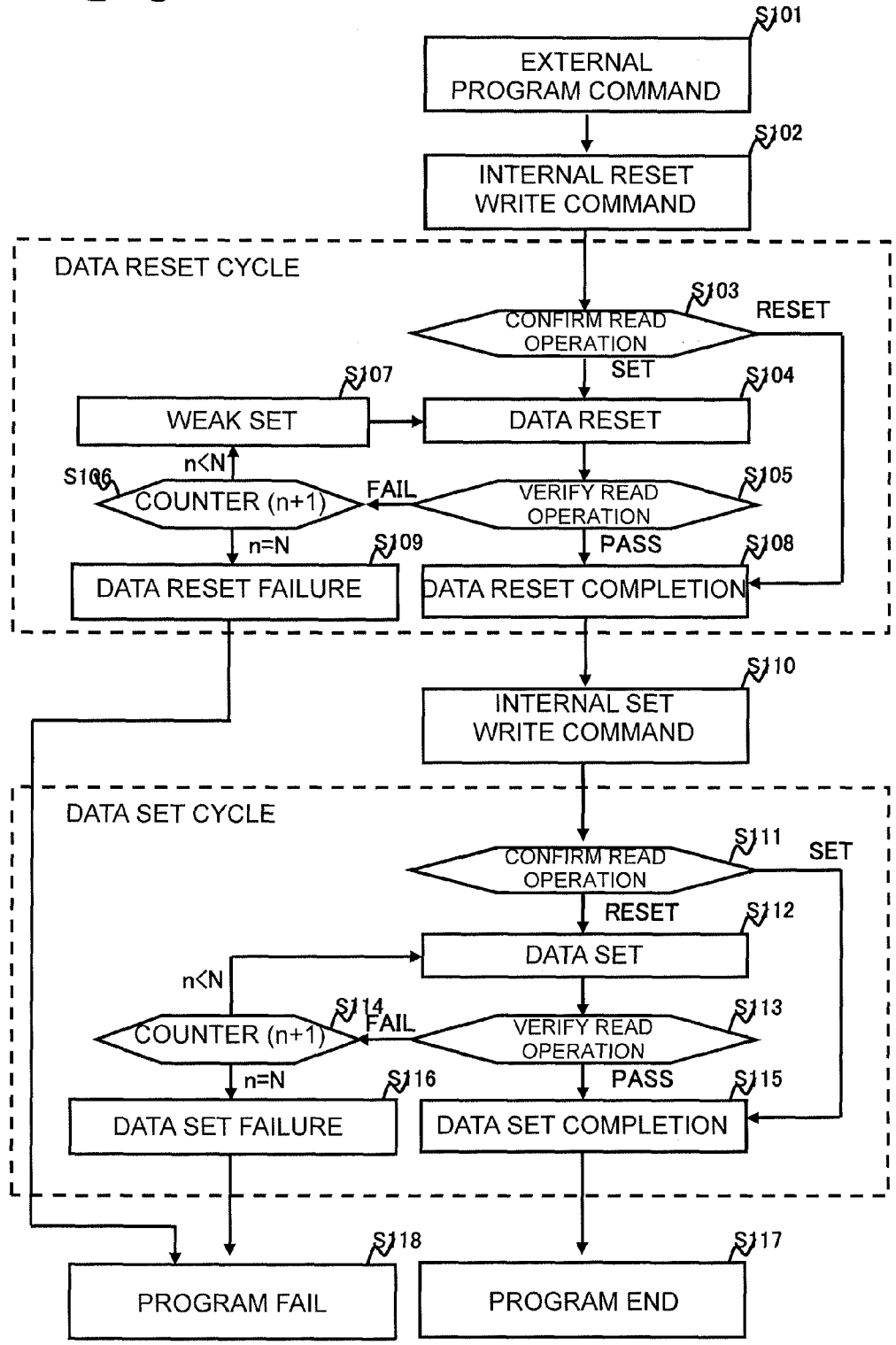
FIG. 6 is a flowchart showing an example of operations of the semiconductor device 1 when a program is executed.

FIG. 6 is a flowchart showing an example of operations of the semiconductor device 1 when the program is executed.

The control logic circuit 13, which receives a program command from the outside via the control signal input circuit 11 and the input/output control circuit 12, outputs the internal command INT_com to the array control circuit 27 (steps S101, S102).

The internal command INT_com in step S102 prescribes execution of data reset, with regard to the array control circuit 27. The array control circuit 27 executes a processing cycle related to a data reset. Steps S103 to S109 in FIG. 6 form a data reset cycle.

In step S103, the array control circuit 27 performs a confirm read operation. More specifically, the array control circuit 27 prescribes reading data from a memory cell corresponding to an address for which writing of data is prescribed from the outside, with respect to the sense amplifier 22. At this time, the amplifier control unit 40 included in the array control circuit 27 activates the control signal RDen and the word line control unit 41 activates the control signal WLset. By activating the control signal WLset, the word line WL is connected to the power supply VWLS.

Thereafter, the verify-judge circuit 24 compares data read from the memory cell and data prescribed for writing from the outside (data held by the data buffer 25). If the two items of data match, the verify-judge circuit 24 outputs the judgment signal Judge at an H level, and if they do not match, outputs the judgment signal Judge at an L level.

If the judgment signals Judge_0 to Judge_q do not indicate a data difference (if the judgment signal Judge_all is at an H level), the array control circuit 27 transitions to step S108 and ends the data reset. Here, a result of comparison is taken as indicating a non-match (transition to step S104).

In step S104, the array control circuit 27 executes a data reset. Specifically, by activating the control signal Preset, the amplifier control unit 40 connects the bit line BL to the power supply VRST. By activating the control signal WLreset, the word line control unit 41 connects the word line WL to the power supply VWLR. Since the power supply VEQ is generated as a power supply of higher potential than the power supply VRST, the third current flows in the second direction (refer to FIG. 5(C)). It is to be noted that since the voltage VWLR is a higher voltage than the voltage VWLS, the potential of the word line WL is controlled to be higher than the potential of the word line WL when data is read. However, the voltage VWLR is not limited to a voltage higher than the voltage VWLS; the two may have a matching voltage, or the voltage VWLR may be lower than the voltage VWLS.

In step S105, the array control circuit 27 performs a verify read operation. In this step, the verify-judge circuit 24 again compares data read from the memory cell and data stored in the data buffer 25. If the judgment signal Judge_all does not indicate a data difference, the array control circuit 27 transitions to step S108 and ends the data reset. Here, a result of comparison is taken as indicating a non-match (transition to step S106).

In step S106, a judgment is made as to whether or not the number of times a data reset cycle has been executed has reached a predetermined number. The array control circuit 27 increments the number of times n the data reset cycle has been executed (n is a positive integer; this also applies below), together with confirming whether or not this is less than a predetermined value N (N is a positive integer; this also applies below). In a case where the number of data reset cycles reaches the predetermined number N, a transition is made to step S109 and a data reset failure is confirmed.

It is to be noted that in a case where even if the data reset cycle is repeated the predetermined N times, the judgment signal Judge_all does not have an H level and data reset failure is confirmed, a transition is made to step S118. In step S118, the signal Pfail indicating program fail is outputted to the outside.

If the number of repeated data reset cycles does not reach the predetermined number of times N, the array control circuit 27 executes a weak set (step S107).

In step S107, by activating the control signal Pwset, the amplifier control unit 40 connects the bit line BL to the power supply VWSET. By activating the control signal WLset, the word line control unit 41 connects the word line WL to the power supply VWLS. Since the power supply VWSET is generated as a power supply of higher potential than the power supply VEQ, a current flows in the variable resistance element 30 with regard to the first direction. However, since the power supply VWSET is generated as a power supply of lower potential than the power supply VSET, the second current smaller than the first current flowing in the variable resistance element 30 in a data set, to be described later, flows in the variable resistance element 30. That is, the second current flows in the variable resistance element 30 in the first direction at a time of a weak set (refer to FIG. 5(B)). It is to be noted that the potential of a word line WL at the time of the weak set is controlled to be lower than the potential of the word line WL at a time of a data reset.

When the weak set is ended in step S107, data reset (step S104) and a verify reading operation (step S105) are again executed.

It is to be noted that even if data reset with regard to a particular memory cell is ended, the array control circuit 27 continues to output control signals of each thereof until the data reset is ended for all memory cells. Here, in order that unnecessary current does not flow with regard to memory cells for which processing has already ended, the gate circuit 44 and the SR latch 45 are provided. That is, after the judgment signal Judge outputs at an H level indicating matching data, when the SR latch 45 is set, the gate circuit 44 that receives output of the SR latch 45 deactivates each control signal.

In a case where the judgment signal Judge_all (corresponding to RES_com in FIG. 1) indicates an H level that indicates matching for all data, the control logic circuit 13 detects that the data reset has ended for all memory cells and outputs the internal command INT_com in order to execute the next data set (step S110). In response to this, the amplifier control unit 40 and the word line control unit 41 stop a data reset cycle (steps S103 to S107 in FIG. 6), and transition to the next data set cycle.

The array control circuit 27 executes a processing cycle related to a data set. Processing shown in steps S111 to S116 in FIG. 6 is a data set cycle.

In the data set cycle and the data reset cycle, in addition to the state of the variable resistance element 30 being varied, there is a difference with regard to whether or not a weak set is executed. In the data reset cycle, a weak set is executed (step S107). However, in the data set cycle, processing equivalent to the weak set is not carried out. It is to be noted that since there is no point of difference in confirm read operations (step S103, step S111) in the data reset cycle and the data set cycle, a description thereof is omitted. With regard to judging concerning verify read operations (step S105, step S113) or the number of times a series of cycles is repeated (step S106, step S114), since there is no point of difference regarding a data reset cycle and a data set cycle, a description thereof is omitted.

In step S112, the array control circuit 27 executes a data set. Specifically, by activating the control signal Pset, the amplifier control unit 40 connects the bit line BL to the power supply VSET. By activating the control signal WLset, the word line control unit 41 connects the word line WL to the power supply VWLS. Since the power supply VSET is generated as a power supply of higher potential than the power supply VEQ, a current flows in the variable resistance element 30 according to the first direction. Since the power supply VSET is generated as a power supply of higher potential than the power supply VWSET, the first current larger than the second current flowing in the variable resistance element 30 at the time of a weak set flows in the variable resistance element 30 (refer to FIG. 5(A)).

In step S115, if the data set is completed, the program ends (step S117).

In step S116, if a data set fail is confirmed, a program fail is notified to the outside, and processing ends (step S118).

Next, a description is given concerning operations of the semiconductor device 1, making reference to a waveform diagram.

Figure 7:
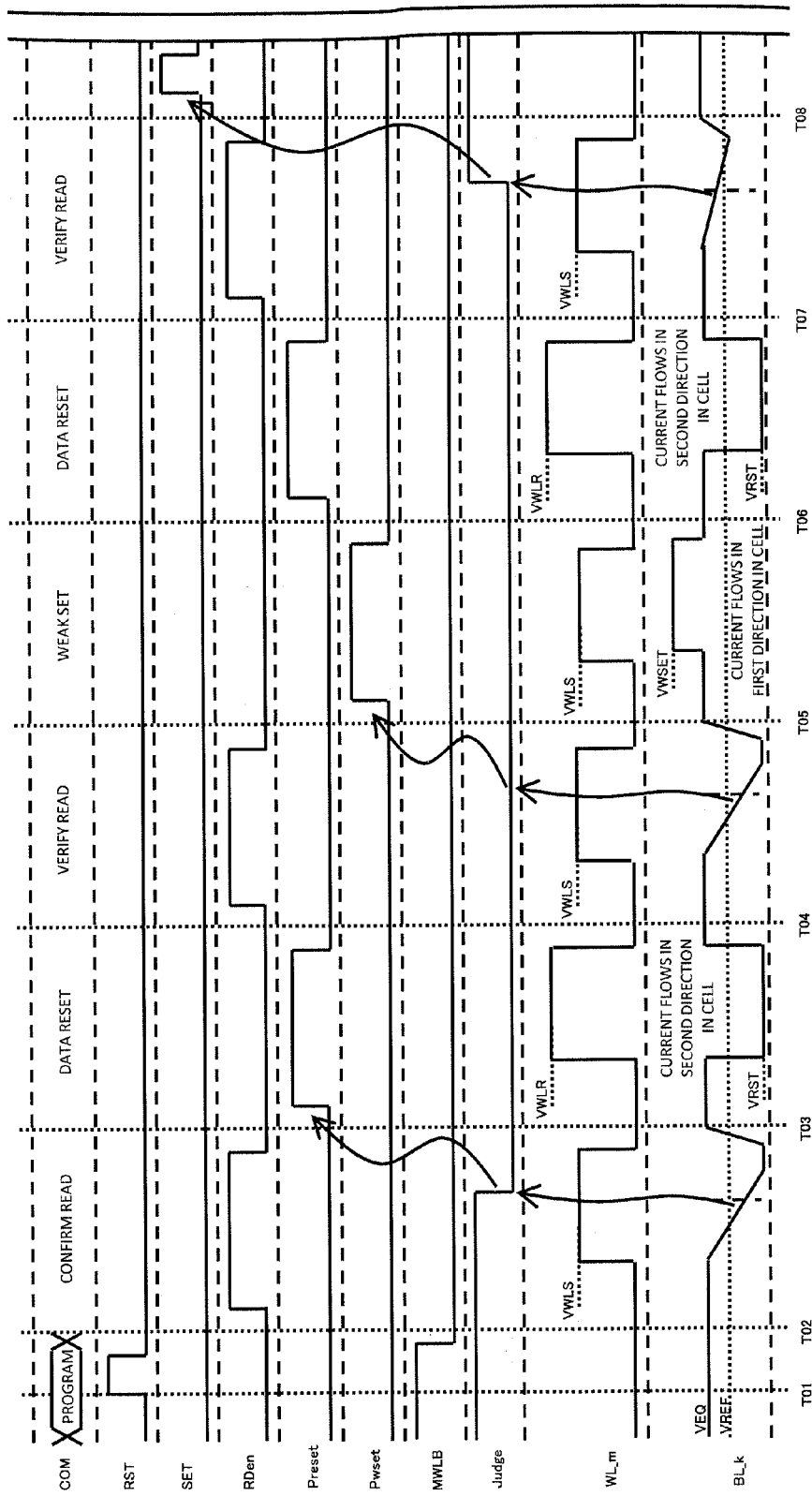
FIG. 7 is a diagram showing an example of a waveform diagram for a data reset cycle.

FIG. 7 is a diagram showing an example of a waveform diagram for a data reset cycle.

At time T01, when a program command is issued from the outside, the control logic circuit 13 issues the internal command INT_com prescribing a data reset.

Time T02 to T03 is a confirm read operation time-period. In the confirm read operation time-period, the amplifier control unit 40 activates the control signal RDen, and a bit line BL_k is cut off from the power supply VEQ. The word line control unit 41 connects a word line WL_m to the power supply VWLS. After precharging the bit line BL_k to the power supply VEQ and then waiting a prescribed time with a floating condition, the sense amplifier 22 compares the potential of the bit line BL_k and the reference voltage VREF, to perform data reading. In FIG. 7, the read data and data prescribed to be written to a memory cell do not match, and the judgment signal Judge transitions to an L level.

Time T03 to T04 is a data reset time-period. In the data reset time-period, the amplifier control unit 40 activates the control signal Preset and connects the bit line BL to the power supply VRST. The word line control unit 41 connects a word line WL_m to the power supply VWLR and turns the selection transistor 31 ON. In this regard, since the voltage VEQ is a higher potential than the voltage VRST, the third current in the second direction flows in the variable resistance element 30, and a data reset is performed.

Time T04 to T05 is a verify read operation time-period. Control in the verify read operation time-period is similar to the confirm read operation time-period. In FIG. 7, the read data and data prescribed to be written to a memory cell do not match, and the judgment signal Judge maintains an L level. As a result, the weak set is executed.

Time T05 to T06 is a weak set time-period. In the weak set time-period, the amplifier control unit 40 activates the control signal Pwset and connects a bit line BL_k to the power supply VWSET. The word line control unit 41 connects the word line WL_m to the power supply VWLS and turns the selection transistor 31 ON. In this regard, since the voltage VWSET is a higher potential than the voltage VEQ, the second current in the first direction flows in the variable resistance element 30. However, since the voltage VWSET is a lower voltage than the voltage VSET, the second current, which is smaller than the first current flowing in the variable resistance element 30 at the time of a data set, flows.

Time T06 to T07 is a data reset time-period. Time T07 to T08 is a verify read operation time-period. In FIG. 7, in the verify read operation time-period with regard to time T07 to T08, the read data and data prescribed to be written to a memory cell match, and the judgment signal Judge has an H level. Thereafter, the processing transitions from a data reset cycle to a data set cycle.

Figure 8:
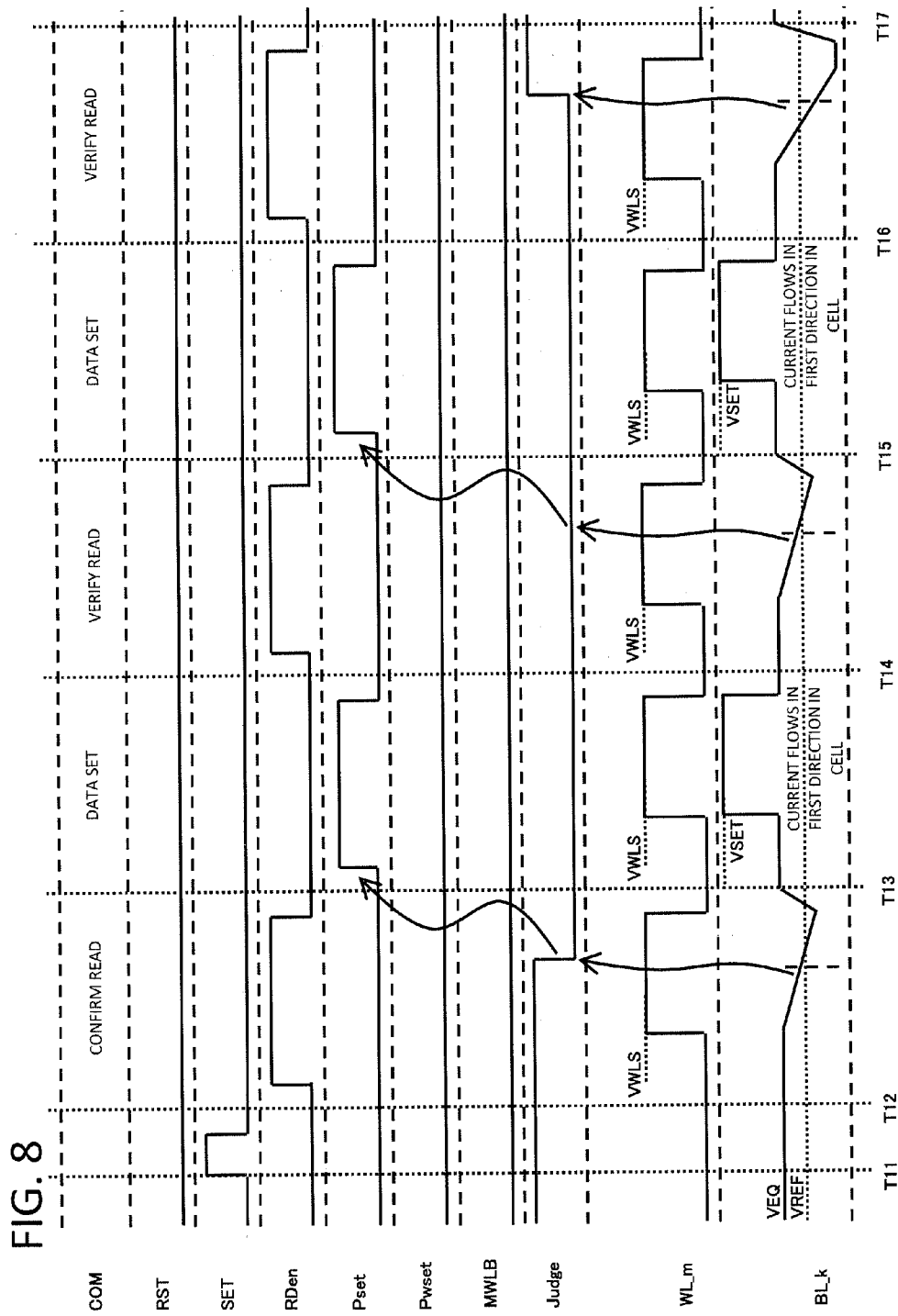
FIG. 8 is a diagram showing an example of a waveform diagram for a data set cycle.

FIG. 8 is a diagram showing an example of a waveform diagram for a data set cycle.

At time T11, the control logic circuit 13 issues the internal command INT_com prescribing a data set.

Time T12 to T13 is a confirm read operation time-period. Since there is no point of difference in confirm read operations in the data set cycle and confirm read operations in the data reset cycle, a further description thereof is omitted. Furthermore, since there is no point of difference in verify read operations in the data set cycle and verify read operations in the data reset cycle, a further description thereof is omitted.

Time T13 to T14 is a data set time-period. In the data set time-period, the amplifier control unit 40 activates the control signal Pset and connects the bit line BL_k to the power supply VSET. The word line control unit 41 connects the word line WL_m to the power supply VWLS and turns the selection transistor 31 ON. In this regard, since the voltage VSET is a higher voltage than the voltage VEQ, a current in the first direction flows in the variable resistance element 30. Since the voltage VSET is a higher voltage than the voltage VWSET, the first current, which is larger than the second current flowing in the variable resistance element 30 at the time of a weak set, flows. By the first current flowing in the variable resistance element 30 and the variable resistance element 30 having a low resistance state, data is set in a memory cell.

FIGS. 9A to 9D are diagrams for describing an effect of a weak set. In FIGS. 9A to 9D, respective vertical axes indicate non-defective rate (proportion of bits that pass a test: PassBit (%)), and horizontal axes indicate judgment resistance values. Raising a forming resistance by an order of magnitude means that a judgment resistance value for data reset is 500Ω when the resistance value of the variable resistance element at a time of forming is 50Ω. That is, if the resistance value is at least 500Ω, the result is "pass" (good memory cell), but if the resistance value is less than 500Ω, the result is "fail" (defective memory cell). It is to be noted that such a condition is an example, and if a material condition or the like changes, the numerical value also changes.

Figure 9A:
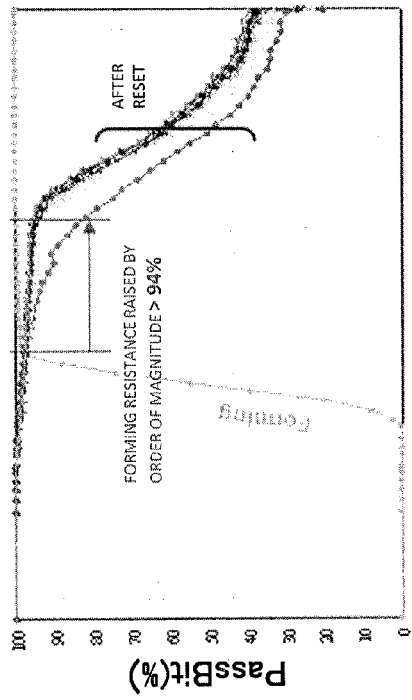
FIGS. 9A to 9D are diagrams for describing an effect of weak set.

FIG. 9A is a diagram indicating the proportion (%) of memory cells that have passed in a case of repeatedly implementing a data reset, without executing verify read and a weak set, with respect to a plurality of memory cells in a set state after forming. In FIG. 9A, 89% of cells pass after 8 loops.

Figure 9B:
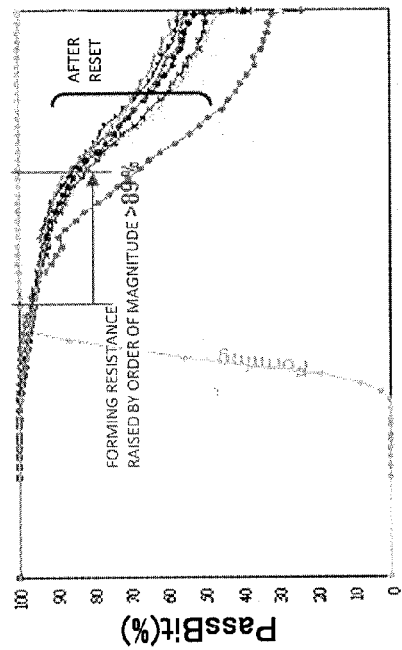

FIG. 9B is a diagram indicating the proportion (%) of memory cells that have passed in a case in which a weak set is not executed but verify read is implemented and data reset is repeatedly implemented only on failed memory cells. In FIG. 9B, 94% of cells pass. The pass result shown in FIG. 9B being better than the pass result shown under the condition of FIG. 9A suggests the presence of a memory cell that, after once passing, undergoes a data reset and fails.

Figure 9C:
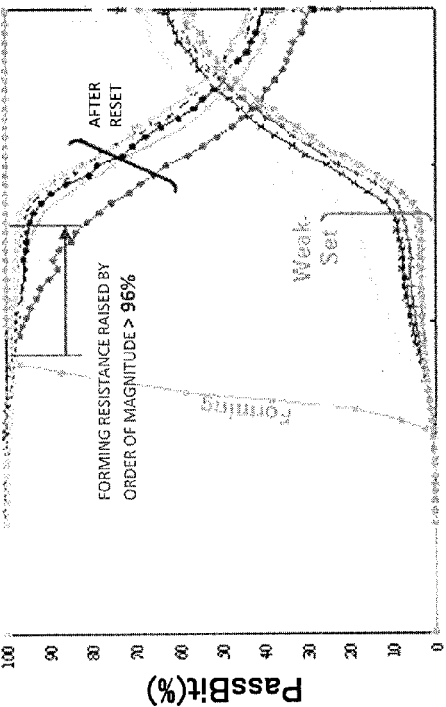

FIG. 9C is a diagram indicating the proportion (%) of memory cells that have passed in a case in which verify read is not executed but a weak set is implemented and a data reset is repeatedly implemented only on failed memory cells. In FIG. 9C, 93% of cells pass, a value that is much better than the result of FIG. 9A. That is, it is possible to recognize the effect of the weak set from FIG. 9C.

Figure 9D:
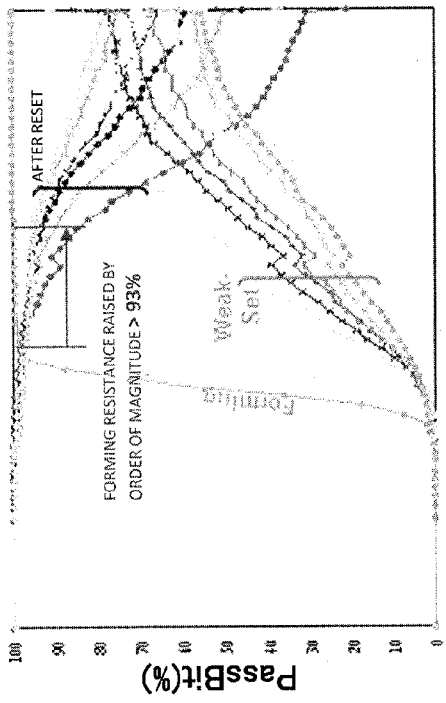

FIG. 9D is a diagram indicating the proportion (%) of memory cells that have passed in a case in which verify read and a weak set are implemented and a data reset is repeatedly implemented only on failed memory cells. In FIG. 9D, as the best result 96% of memory cells pass. That is, by performing the weak set, it can be anticipated that looping will be ended earlier than with repeating the data reset. The result indicated in FIG. 9D shows that control to implement verify read and weak set is favorable from the viewpoint of power consumption and operation speed.

Although the variable resistance element in a case of a failure in a data reset does not have a high resistance as at a time of a data reset, it is considered to be in an incomplete resistance state (incomplete state) not having resistance as low as at a time of a data set. From this state, even if a data reset is further performed, for example, since the variable resistance element itself has an incomplete high resistance, the amount of current flowing is small. As a result, a current sufficient for resistance variation does not flow. Therefore, a weak set is performed to shift this incomplete high resistance state once to a low resistance and return to a state where a current is flowing. Here, if a data set is performed rather than a weak set, there is a possibility of shifting more than necessary to a low resistance side and in continuing a data reset, a high resistance may not be reached. Therefore, a weak set (small current) that is weaker than a data set is performed.

As described above, in the semiconductor device 1 according to the present exemplary embodiment, in a case of repeatedly performing a data reset on the same memory cell in a program, a weak set, where a small current flows in the same direction as the data set, is interposed. As a result, it is possible to complete the program operation in a suitable number of times, and without more current than necessary flowing.

Second Exemplary Embodiment

Next, a detailed description is given concerning a second exemplary embodiment, making reference to the drawings.

Figure 10:
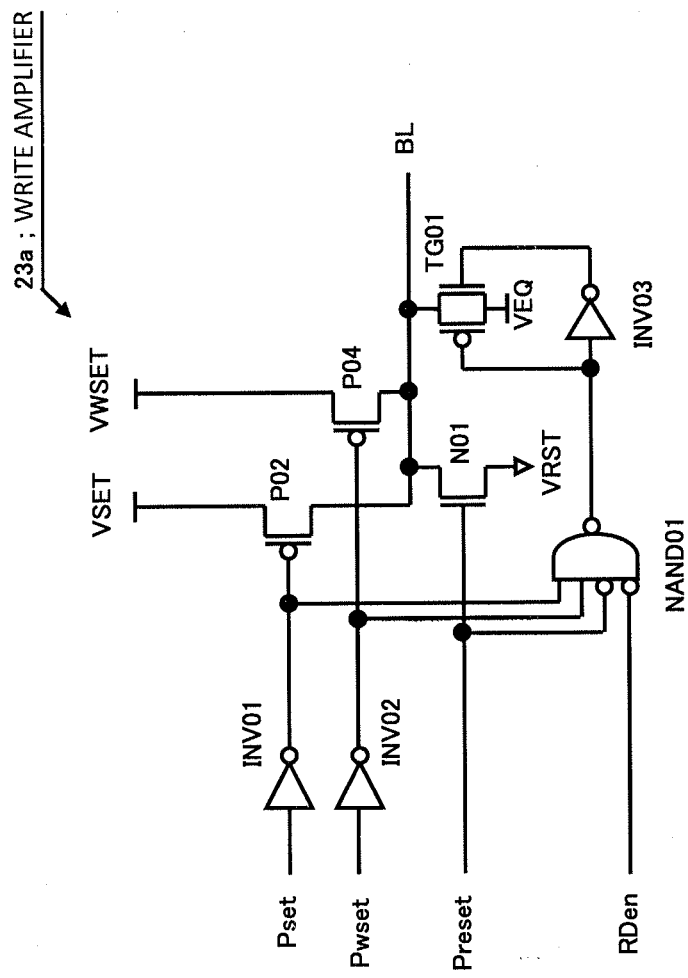
FIG. 10 is a diagram showing an example of a circuit configuration of a write amplifier 23a included in a semiconductor device 2 according to a second exemplary embodiment.

FIG. 10 is a diagram showing an example of a circuit configuration of a write amplifier 23a included in a semiconductor device 2 according to the present exemplary embodiment. In FIG. 10, component elements similar to FIG. 3 are given the same reference symbols and a description thereof is omitted.

The write amplifier 23 described in the first exemplary embodiment may have a circuit configuration as shown in FIG. 10. In the write amplifier 23, with regard to a common source power supply VSET, a portion in which current is controlled by two reference power supplies (VSETREF, VWSETREF) corresponds, in the write amplifier 23a shown in FIG. 10, to changing the potential of the power supply itself. It is to be noted that, as described above, the power supply VSET is a higher potential than the power supply VWSET. Even if the write amplifier 23a shown in FIG. 10 is used, it is possible to provide the semiconductor device 2 in which a data write operation is completed in a suitable number of times, without more current than necessary being made to flow.

Third Exemplary Embodiment

Next, a detailed description is given concerning a third exemplary embodiment, making reference to the drawings.

Figure 11:
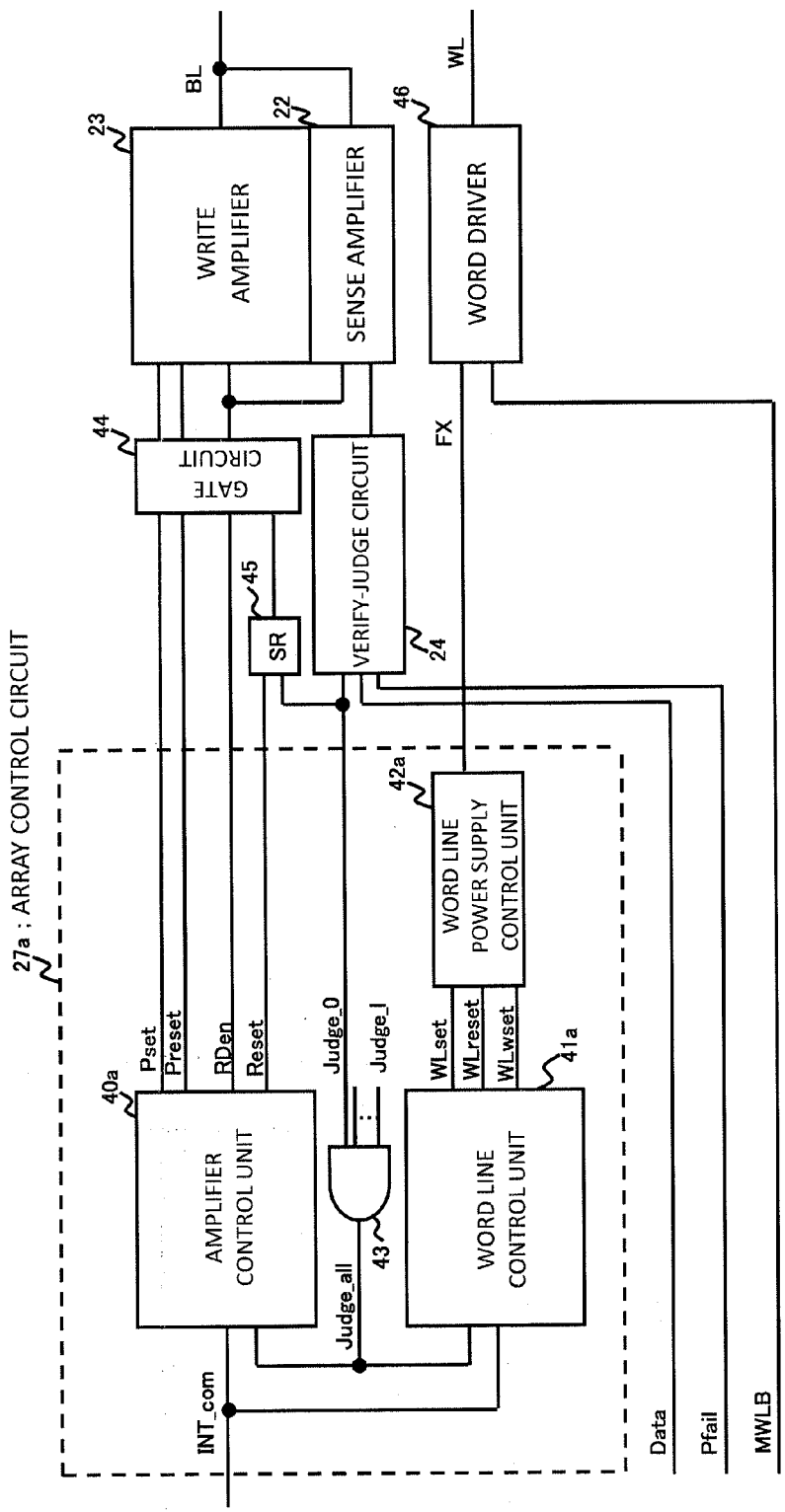
FIG. 11 is a diagram showing an example of an internal configuration of an array control circuit 27a and an example of various types of circuit included in respective banks, related to semiconductor device 3 according to a third exemplary embodiment.

FIG. 11 is a diagram showing an example of an internal configuration of an array control circuit 27a and an example of various types of circuit included in respective banks, which are included in a semiconductor device 3 according to the present exemplary embodiment. In FIG. 11, component elements similar to FIG. 1 are given the same reference symbols and a description thereof is omitted.

In the array control circuit 27a, a second current flowing in a variable resistance element 30 at a time of a weak set is realized by switching a power supply connected to a word line WL, without performing control by a control signal Pwset. More specifically, in a case where execution of a weak set is necessary at time of a data reset cycle, a word line control unit 41a activates a control signal WLwset.

Figure 12:
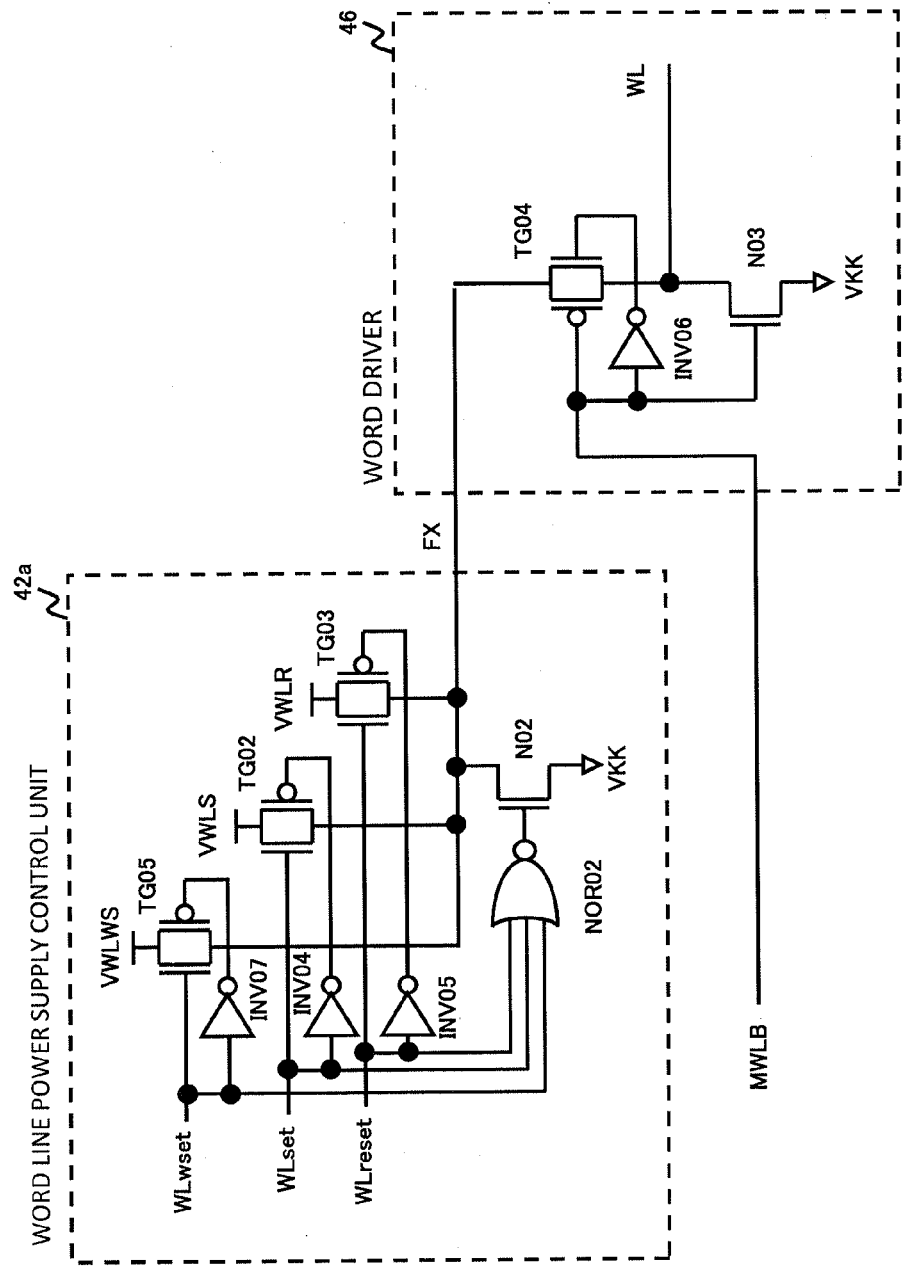
FIG. 12 is a diagram showing an example of a circuit configuration of a word line power supply control unit 42a and the word driver 46.

FIG. 12 is a diagram showing an example of a circuit configuration of a word line power supply control unit 42a and a word driver 46. In FIG. 12, component elements similar to FIG. 4 are given the same reference symbols and a description thereof is omitted. The word line power supply control unit 42a connects a power supply VWLWS to a sub word line FX, in response to the control signal WLwset. By having the voltage VWLWS lower than a voltage VWLS, a voltage applied to a gate of a selection transistor 31 is made low, and a second current, smaller than a first current flowing in the variable resistance element 30 at a time of a data set, flows in the variable resistance element 30.

In this way, by switching the power supply connected to a word line WL, it is possible to provide the semiconductor device 3 in which a data write operation is completed in a suitable number of times, without more current than necessary being made to flow.

Fourth Exemplary Embodiment

Next, a detailed description is given concerning a fourth exemplary embodiment, making reference to the drawings.

In the first to third exemplary embodiments, when a data set is carried out consecutively, this is not done via a weak reset. As described above, a weak reset relates to the concept of a weak set pair, and is an operation in which current flows in the same direction as for a data reset, when a data set is performed consecutively, but control is performed to make the current amount small. In the first to third exemplary embodiments, the reason for not describing the necessity of a weak reset is that it is possible to have current flow rather than a data reset, even in an incomplete data set state (it is possible to have a current necessary for a data set to flow in a variable resistance element 30).

However, with regard to an incomplete data set state, if a data set is additionally executed, there is a concern of there being a shift to a low resistance side more than necessary, and of an increased divergence from resistance value of other memory cells in a data set state (variability of resistance values becomes large). A weak reset contributes to reducing variability of resistance values of the variable resistance element 30.

Figure 13:
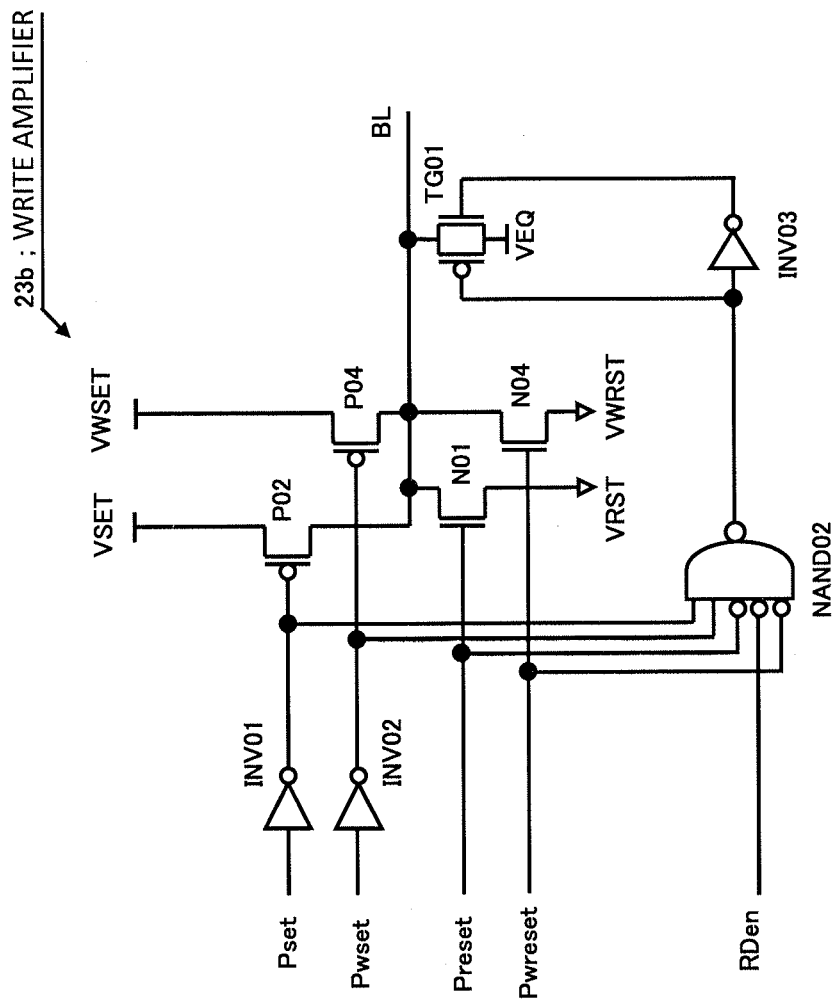
FIG. 13 is a diagram showing an example of a circuit configuration of a write amplifier 23b of a semiconductor device 4 according to a fourth exemplary embodiment.

FIG. 13 is a diagram showing an example of a circuit configuration of a write amplifier 23b of a semiconductor device 4 according to the present exemplary embodiment. In FIG. 13, component elements similar to FIG. 10 are given the same reference symbols and a description thereof is omitted.

In the write amplifier 23b, a power supply VWRST is connected to a bit line BL in response to a control signal Pwreset. By having the voltage VWRST higher than a voltage VRST, a weak reset is realized by a fourth current flowing in a second direction of the variable resistance element 30, the fourth current being smaller than a third current. It is to be noted that the control signal Pwreset is outputted by an amplifier control unit 40b included in the semiconductor device 4 according to the present exemplary embodiment.

In order to realize a function by which the fourth current flows in the second direction in the variable resistance element 30, FIG. 13 has a configuration where the voltage VWRST for a weak reset is supplied to a bit line BL, but the same function can also be realized by supplying a potential for a weak reset to a word line as in FIG. 12. By adding the power supply VWLWR for a weak reset and a control signal WLwrset to the power supply for a word line shown in FIG. 12, the potential of the word line is controlled to VWLWRS when WLwrset is activated. For example, in a case where the potential of VWLWRS and VWLWS can be controlled to the same extent, it is possible for these to be shared.

Figure 14:
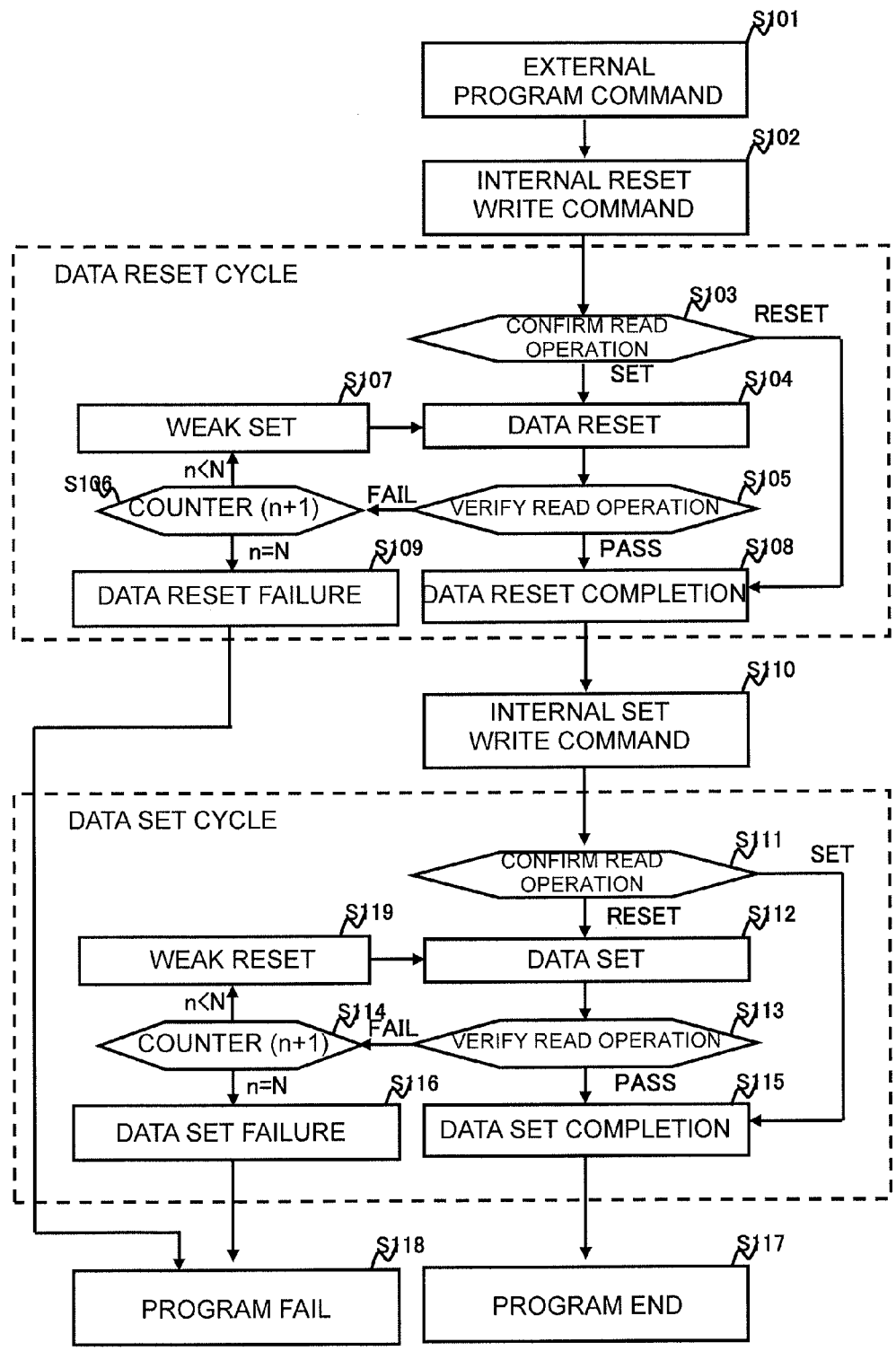
FIG. 14 is a flowchart showing an example of operations of the semiconductor device 4 when a program is executed.

FIG. 14 is a flowchart showing an example of operations of the semiconductor device 4 when a program is executed. Since the difference between flowcharts shown in FIG. 14 and FIG. 6 is the addition of a weak reset of step S119, a description concerning other steps is omitted.

In the semiconductor device 4, with regard to a data set cycle, when a data set is carried out consecutively, by doing this via a weak reset (step S119), an incomplete data set state with regard to the variable resistance element 30 is returned to a normal data reset state. Thereafter, by executing a data set, it is possible to reduce variability of resistance value of the variable resistance element 30.

It is to be noted that interfaces of the semiconductor devices 1 to 4 are equivalent to those for flash memory, but this does not limit the interface of the semiconductor device. For example, it is also possible to provide an interface as for DRAM (Dynamic Random Access Memory), consolidated with a CPU (Central Processing Unit). The variable resistance elements in the first to fourth exemplary embodiments were described using what is called ReRAM (Resistance Random Access Memory), but application is also possible to MRAM (Magnetoresistive Random Access Memory) or the like.

It should be noted that following control methods are possible.

<Method 1>

A control method for a semiconductor device, comprising: changing a variable resistance element from a first resistance state to a second resistance state by having a first current flow from a first end to a second end of the variable resistance element; having a second current smaller than the first current flow from the first end to the second end of the variable resistance element; and changing the variable resistance element from the second resistance state to the first resistance state by having a third current flow from the second end to the first end.

<Method 2>

The control method for a semiconductor device according to method 1, further comprising: verifying whether or not a resistance state of the variable resistance element is in the first resistance state, wherein having the second current flow comprises having the second current flow in the variable resistance element in a case where the resistance state of the variable resistance element is in the first resistance state.

The respective disclosures of the abovementioned cited patent literatures are incorporated herein by reference thereto. Modifications and adjustments of embodiments and examples are possible within the bounds of the entire disclosure (including the scope of the claims) of the present invention, and also based on fundamental technological concepts thereof. Furthermore, multiple combinations and selections of various disclosed elements (including respective elements of the respective claims, respective elements of the respective exemplary embodiments and examples, and respective elements of the respective drawings) are possible within the scope of the claims of the present invention. That is, the present invention clearly includes all types of transformation and modification that a person skilled in the art can realize according to the entire disclosure including the scope of the claims and to technological concepts thereof. In particular with regard to numerical ranges described herein, any numerical value or small range included in the range in question should be interpreted as being specifically described even in a case where there is no particular description.

What is claimed is:

1. A semiconductor device, comprising:
a variable resistance element, and
a control circuit that controls a resistance state of the variable resistance element by controlling current between a first end and a second end of the variable resistance element, wherein
the control circuit has a first current flow from the first end to the second end of the variable resistance element to cause the variable resistance element to change from a first resistance state to a second resistance state, and after having a second current smaller than the first current flow from the first end to the second end of the variable resistance element, the control circuit has a third current flow from the second end to the first end to cause the variable resistance element to change from the second resistance state to the first resistance state, wherein the control circuit, after having the third current flow in the variable resistance element without having the second current flow in the variable resistance element, in a case where the variable resistance element is not in the first resistance state, after having the second current flow in the variable resistance element, has the third current flow, to have the variable resistance element in the first resistance state.

2. The semiconductor device according to claim 1, wherein the control circuit, after having the third current flow in the variable resistance element, as a result of verifying whether or not a resistance state of the variable resistance element is in the first resistance state, in a case where the variable resistance element is not in the first resistance state, has the second current flow in the variable resistance element.

3. The semiconductor device according to claim 1, wherein the control circuit, after confirming whether or not the resistance state of the variable resistance element is in the first resistance state, has the third current flow in the variable resistance element.

4. A semiconductor device, comprising:
a variable resistance element, and
a control circuit that controls a resistance state of the variable resistance element by controlling current between a first end and a second end of the variable resistance element, wherein
the control circuit has a first current flow from the first end to the second end of the variable resistance element to cause the variable resistance element to change from a first resistance state to a second resistance state, and after having a second current smaller than the first current flow from the first end to the second end of the variable resistance element, the control circuit has a third current flow from the second end to the first end to cause the variable resistance element to change from the second resistance state to the first resistance state, wherein the control circuit has the third current flow in the variable resistance element to cause a change from the second resistance state to the first resistance state, and after having a fourth current smaller than the third current flow from the second end to the first end of the variable resistance element, has the first current flow in the variable resistance element to cause a change from the first resistance state to the second resistance state.

5. A semiconductor device comprising:
a variable resistance element;
a control circuit configured to generate a first current flowing inside the variable resistance element in a first direction, to generate a second current smaller than the first current flowing inside the variable resistance element in the first direction and to generate a third current flowing inside the variable resistance element in a second direction opposite to the first direction; and
first and second voltage lines respectively supplied with first and second voltages different in potential from each other, the control circuit including a first transistor coupled between the first voltage line and the bit line and a second transistor coupled between the second voltage line and the bit line, the first current being generated when the first transistor turns on, the second current being generated when the second transistor turns on.

6. A semiconductor device comprising:
a variable resistance element;
a control circuit configured to generate a first current flowing inside the variable resistance element in a first direction, to generate a second current smaller than the first current flowing inside the variable resistance element in the first direction and to generate a third current flowing inside the variable resistance element in a second direction opposite to the first direction; and
a third and fourth voltage lines respectively supplied with third and fourth voltages different in potential from each other, the control circuit that includes:
an internal voltage line;
a third transistor coupled between the third voltage line and the internal voltage line;
a fourth transistor coupled between the fourth voltage line and the internal voltage line; and
a word driver coupled to the internal voltage line and the word line, the word driver being configured to drive the word line at a potential of the internal voltage line.

7. The semiconductor device according to claim 6, wherein the third transistor takes an on-state and the fourth transistor takes an off-state in a first operation mode and the third transistor takes the off-state and the fourth transistor takes the on-state in a second operation mode.

* * * * *